(12) United States Patent
Mimino et al.

(10) Patent No.: US 6,747,299 B2
(45) Date of Patent: Jun. 8, 2004

(54) HIGH FREQUENCY SEMICONDUCTOR DEVICE

(75) Inventors: Yutaka Mimino, Yamanashi (JP); Osamu Baba, Yamanashi (JP); Yoshio Aoki, Yamanashi (JP); Muneharu Gotoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 54 days.

(21) Appl. No.: 10/090,633

(22) Filed: Mar. 6, 2002

(65) Prior Publication Data

US 2002/0140006 A1 Oct. 3, 2002

(30) Foreign Application Priority Data

Mar. 30, 2001 (JP) ........................................ 2001-099955

(51) Int. Cl.[7] ............................................ H01L 21/338
(52) U.S. Cl. ...................... 257/259; 257/752; 257/753; 257/275; 257/276; 257/296; 361/386; 361/413; 361/414; 361/794; 361/792; 438/167; 438/186
(58) Field of Search ................................ 257/752, 753, 257/275, 276, 259, 296; 361/386, 413, 414, 794, 792; 438/168, 186

(56) References Cited

U.S. PATENT DOCUMENTS

| | | | | |
|---|---|---|---|---|
| 4,739,448 A | * | 4/1988 | Rowe et al. | 361/386 |
| 4,789,809 A | * | 12/1988 | Christensen | 315/39 |
| 5,272,600 A | * | 12/1993 | Carey | 361/792 |
| 5,354,599 A | * | 10/1994 | McClanahan et al. | 428/209 |
| 5,384,486 A | * | 1/1995 | Konno | 257/275 |
| 5,396,397 A | * | 3/1995 | McClanahan et al. | 361/313 |
| 5,402,318 A | * | 3/1995 | Otsuka et al. | 361/794 |
| 5,519,176 A | * | 5/1996 | Goodman et al. | 172/255 |
| 5,854,534 A | * | 12/1998 | Beilin et al. | 257/691 |
| 6,002,593 A | * | 12/1999 | Tohya et al. | 361/765 |
| 6,075,211 A | * | 6/2000 | Tohya et al. | 174/255 |
| 6,225,958 B1 | * | 5/2001 | Amano et al. | 343/767 |

FOREIGN PATENT DOCUMENTS

| | | |
|---|---|---|
| JP | 63-052466 | 3/1988 |
| JP | 07-307567 | 11/1995 |
| JP | 08-162621 | 6/1996 |
| JP | 2000-269429 | 9/2000 |

OTHER PUBLICATIONS

Office action and translation dated May 20, 2003 from the corresponding Japanese application.

* cited by examiner

*Primary Examiner*—Nathan J. Flynn
*Assistant Examiner*—Fazli Erdem
(74) *Attorney, Agent, or Firm*—Westerman, Hattori, Daniels & Adrian, LLP

(57) ABSTRACT

A high frequency semiconductor device includes a ground plate, an insulating layer, a power-supply conductor, an insulating interlayer, and a strip line as a line conductor. The power-supply conductor is disposed above the ground plate, with the insulating layer provided therebetween. The ground plate and the power-supply conductor have a capacitance formed therebetween. Thus, the line conductor regards the power-supply conductor as having a potential identical to that of the ground plate. This makes it possible to lay out the line conductor without considering the arrangement of the power-supply conductor. In other words, by two-dimensionally overlapping a microstrip line and a power-supply conductor in an MMIC, the degree of freedom in the device layout can be increased.

12 Claims, 9 Drawing Sheets

1a

HIGH FREQUENCY SEMICONDUCTOR DEVICE

BACKGROUND OF THE INVENTION

1. Field of the Invention

The present invention relates to a monolithic microwave integrated circuit (MMIC) in which a waveguide for high frequency signals is used. Each metallic signal line forming the waveguide must be disposed so as to be always integrated with the ground, because a high frequency signal is transmitted not in the line but between the line and the ground.

2. Description of the Related Art

In MMICs containing high speed semiconductor elements, such as high-electron-mobility transistors (HEMTs) and hetero-bipolar transistors (HBTs), a high frequency waveguide in which each signal line is integrated with the ground is needed for wiring so that a high frequency signal is transmitted, differently from ordinary silicon integrated circuits. A microstrip line which has stable line characteristics and weak dispersion characteristics which mean that frequency dependency of a transmission constant Is weak, is used as the high frequency waveguide.

In FIG. 1, among MMICs according to the related art in which microstrip lines used, in particular, a so-called "three-dimensional MMIC" having layers of line conductors is shown. In the three-dimensional MMIC in FIG. 1, a ground plate 3 is provided on a surface insulating layer 2 on the surface of a semiconductor substrate 1. The ground plate 3 combines with line conductors 5 provided on insulating interlayers 4 to form microstrip lines.

The three-dimensional MMIC in FIG. 1 has a superior feature in that the degree of integration is higher than that of a general type of MMIC having two-dimensionally formed layers.

Nevertheless, the three-dimensional MMIC in FIG. 1 has a limitation in that, between each line conductor 5 and the ground plate 3, another conductor cannot be disposed so as to two-dimensionally overlap with the line conductors 5, because the conductor overlapping with the line conductor destroys the structures of the microstrip lines which are formed between each layer of line conductor 5 and the ground plate 3. Accordingly, the three-dimensional MMIC in FIG. 1 has limiting conditions stricter than those of an ordinary silicon integrated circuit.

SUMMARY OF THE INVENTION

As a result of considering conditions for a layout in an MMIC, the present inventor paid attention to layout limiting conditions, in particular, to a condition that the relationship between a power-supply conductor and each line conductor cannot be ignored. In other words, in the above MMIC, a power-supply conductor must be disposed between line conductors since each line conductor cannot be disposed overlapping with another conductor. The power-supply line greatly suppresses the degree of freedom in the arrangement of the line conductors since the lower limit of its width is determined for securing a predetermined current-carrying capacity, and it has a large area for its arrangement.

Accordingly, it is an object of the present invention to provide a three-dimensional MMIC having relaxed layout conditions.

To this end, according to the present invention, the above object is achieved through provision of a high frequency semiconductor device including a semiconductor substrate, a ground plate connected to the ground potential, a power-supply conductor which is provided above the ground plate, with insulating layer provided therebetween, and which is connected to a power-supply potential, and a line conductor provided above the semiconductor substrate, with an insulating interlayer. The line conductor combines with the ground plate or the power-supply conductor to form a high frequency transmission line, and the capacitance between the line conductor and one of the ground plate and the power-supply conductor is smaller than the capacitance between the ground plate and the power-supply conductor.

Preferably, the insulating layer is made of a material having a dielectric constant higher than that of the insulating interlayer.

The insulating layer may be made of material identical to that for the insulating interlayer, and may have a thickness smaller than that of the insulating interlayer.

A plurality of the line conductors may be provided as a plurality of layers, with the insulating interlayers provided therebetween.

The line conductor may be provided as a single layer in connection with the insulating interlayer.

The power-supply conductor may have a plane shape which is substantially identical to that of the ground plate.

The power-supply conductor may be provided in the form of a wiring line.

The power-supply conductor may be provided in the form of a plane on a selected area of surface of the semiconductor substrate.

The power-supply conductor may be provided in the form of a grid.

A plurality of the power-supply conductors may be provided as a plurality of layers each being electrically separated, with the insulating layers provided therebetween, and one of the power-supply conductors may be provided above the ground plate, with one of the insulating layers provided therebetween.

A plurality of the power-supply conductors may be provided, may be electrically separated from each other and may be two-dimensionally disposed on the semiconductor substrate.

A plurality of the ground plates may be disposed along the thickness direction of the semiconductor substrate, and the power-supply conductor may lie above at least one of the ground plates, with the insulating layer provided therebetween.

According to the present invention, a power-supply conductor and a line conductor can be disposed so as to overlap with each other, and the power-supply conductor can be disposed in a large area, so that the degree of freedom in an MMIC layout increases. In addition, the area of the entire semiconductor chip can be reduced because the power-supply conductor and the line conductor overlap with each other two-dimensionally.

DESCRIPTION OF THE PREFERRED EMBODIMENTS

Figure 1:
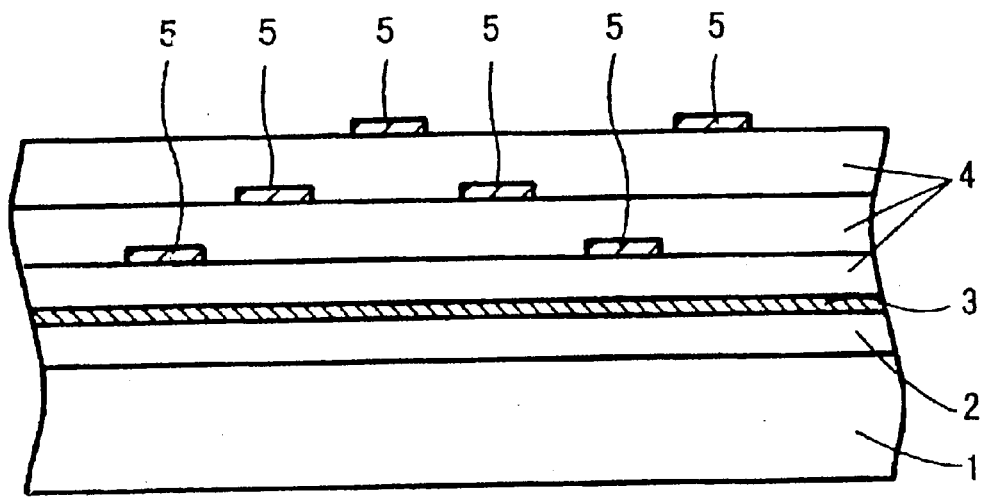
FIG. 1 is a cross-sectional view showing a three-dimensional multilayered MMIC according to the related art.
Figure 2:
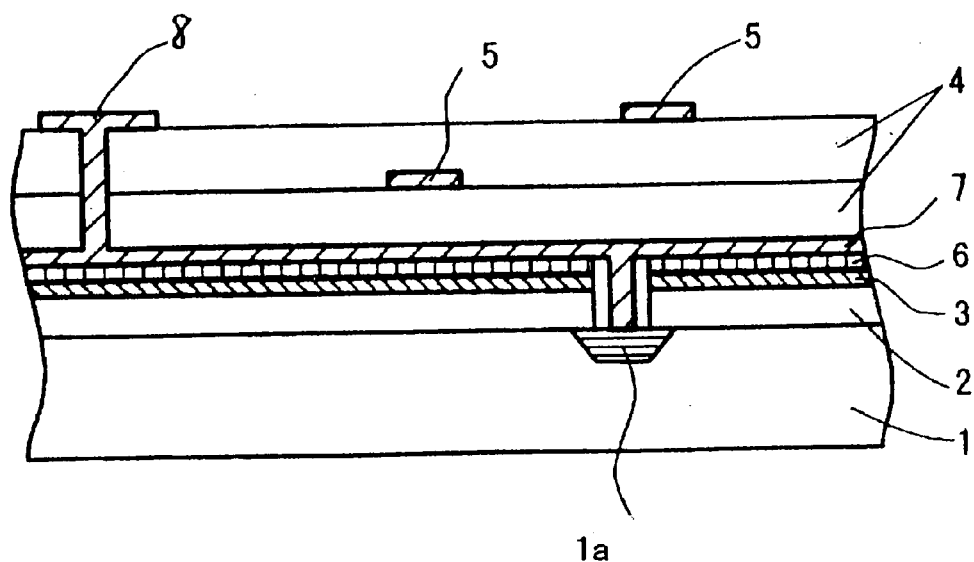
FIG. 2 is a cross-sectional view showing the principle of the present invention.

FIG. 2 illustrates the principle of the present invention and shows a cross-section of a three-dimensional MMIC. In the present invention, a power-supply line is disposed based on the above knowledge, without affecting the arrangement of line conductors. Specifically, a power-supply conductor 7 is provided on an insulating interlayer 6 above a ground plate 3, so that the power-supply conductor 7 is capacitive-coupled with the ground plate 3 via the insulating interlayer 6. Each line conductor 5 is capacitive-coupled with the ground plate 3 or the power-supply conductor 7, via at least one insulating interlayer 4 provided therebetween. The capacitance between the ground plate 3 and the power-supply conductor 7 is larger than that formed between the ground plate 3 or the power-supply conductor 7, and each line conductor 5.

The power-supply conductor 7 can be regarded as having a ground potential in high frequency ranges because it is capacitive-coupled with the ground plate 3 via the insulating layer 6 provided therebetween. Thus, each line conductor 5 uses the power-supply conductor 7 to form each high frequency transmission line. Accordingly, the present invention enables a layout in which each line conductor 5 and the power-supply conductor 7 overlaps with each other.

As described above, in the present invention, it is not necessary to avoid the overlap between the power-supply conductor 7 and each line conductor 5, so that a large layout area for the power-supply conductor can be obtained. Accordingly, it can be easily ensured that the power-supply conductor 7 has a desired current-carrying capacity.

In order that the power-supply conductor 7 may be regarded as a ground plate in a high frequency range, the power-supply conductor 7 must be capacitive-coupled with the ground plate 3, having a certain amount of large capacitance. Specifically, the capacitance between the power-supply conductor 7 and the ground plate 3 must be larger than that formed between each line conductor 5 and one of the ground plate 3 and the power-supply conductor 7. The capacitance between the power-supply conductor 7 and the ground plate 3 can be increased by selecting the material or structure for the insulating layer 6. For example, one which has a dielectric constant larger than that of each insulating interlayer 4 is used as the material for the insulating layer 6. Alternatively, when a material which is identical to that for each insulating interlayer 4 is used for the insulating layer 6, the thickness of the insulating layer 6 is set to be smaller than that of each insulating interlayer 4.

The present invention is described below with reference to embodiments thereof.

Figure 3:
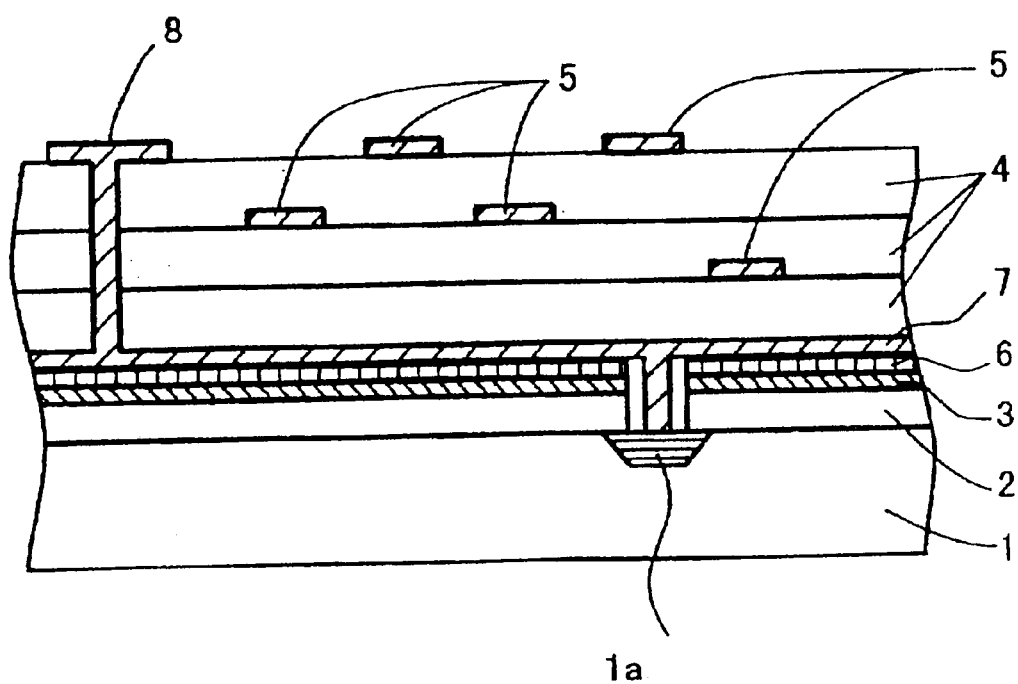
FIG. 3 is a cross-sectional view showing a three-dimensional MMIC according to a first embodiment of the present invention.
Figure 4:
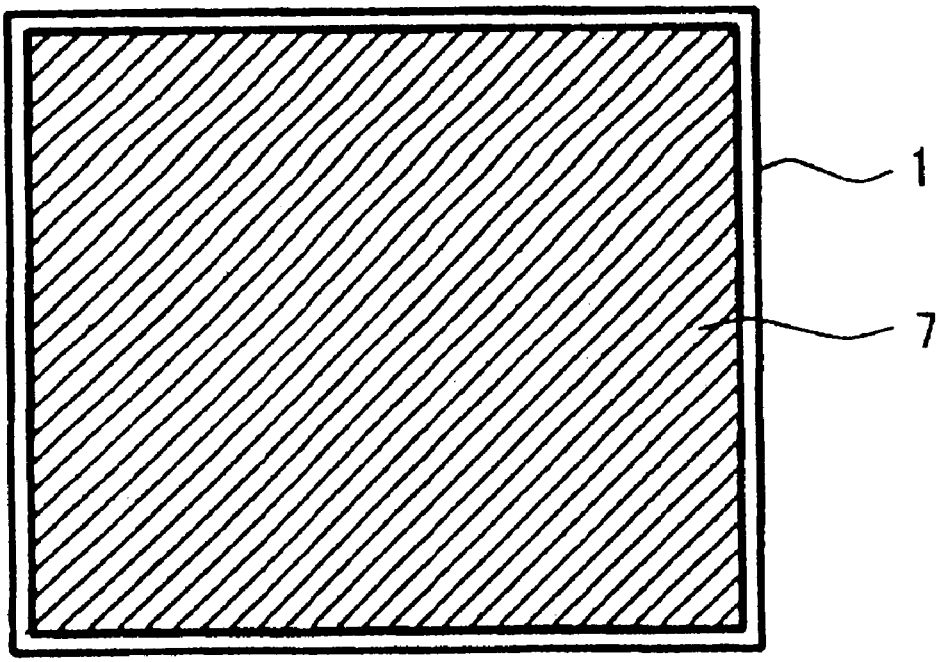
FIG. 4 is a plan view showing the three-dimensional MMIC shown in FIG. 3.

FIG. 3 shows a cross-section of a three-dimensional MMIC according to a first embodiment of the present invention. FIG. 4 is a plan view showing the three-dimensional MMIC according to the first embodiment and shows a layout of a power-supply conductor 7.

The first embodiment relates to an MMIC having a power-supply conductor 7 for supplying power to an activen region 1a (e.g., the drain of an FET) formed on a GaAs semiconductor substrate 1.

A surface insulating layer 2 is formed to protect the surface of the semiconductor substrate 1. A stable material such as silicon nitride is employed as the material for the surface insulating layer 2. A ground plate 3 is disposed on the surface insulating layer 2. The power-supply conductor 7 in the fast embodiment is provided on the insulating layer 6 which covers the ground plate 3, and is capacitive-coupled with the ground plate 3 via the insulating layer 6 provided therebetween. Silicon nitride having a large dielectric constant can be employed as the material for the insulating layer 6. A material such as polyimide for each insulating interlayer 4 used as the material can be used as the material for the insulating layer 6. However, when the material for each insulating interlayer 4 is used as the material for the insulating layer 6, the capacitance between the ground plate 3 and the power-supply conductor 7 must be increased by, for example, thinly forming the insulating layer 6 because polyimide has a relatively low dielectric constant.

As shown in FIG. 4, the power-supply conductor 7 in the first embodiment has a planar shape having a pattern identical to that of the ground plate 3, and is provided lying on the ground plate 3. Since the power-supply conductor 7 is two-dimensionally disposed above the semiconductor substrate 1, a throughhole for connecting the power-supply conductor 7 to a power-supply pad 8 or the active region 1a can be formed at an arbitrary position in the surface of the semiconductor substrate 1. Accordingly, in a case in which a plurality of active regions 1a to which the power-supply potential is connected are formed, the power-supply conductor 7 can be connected to the active regions 1a, without meanderingly laying out the power-supply conductor 7. In addition, in the case of employing a so-called "master slice technique" in which a layout for each device on the semiconductor substrate 1 and a layout for each passive device (e.g., each line conductor 5) above the ground plate 3 are separately designed, the need for re-designing the power-supply conductor 7 is eliminated, even if the active regions 1a are formed in any positions.

In the first embodiment, each line conductor 5 is disposed as desired above the power-supply conductor 7. The present invention can lay out the line conductors 5 without considering the position of the power-supply conductor 7, so that the degree of freedom in the layout operation is increased.

Figure 5:
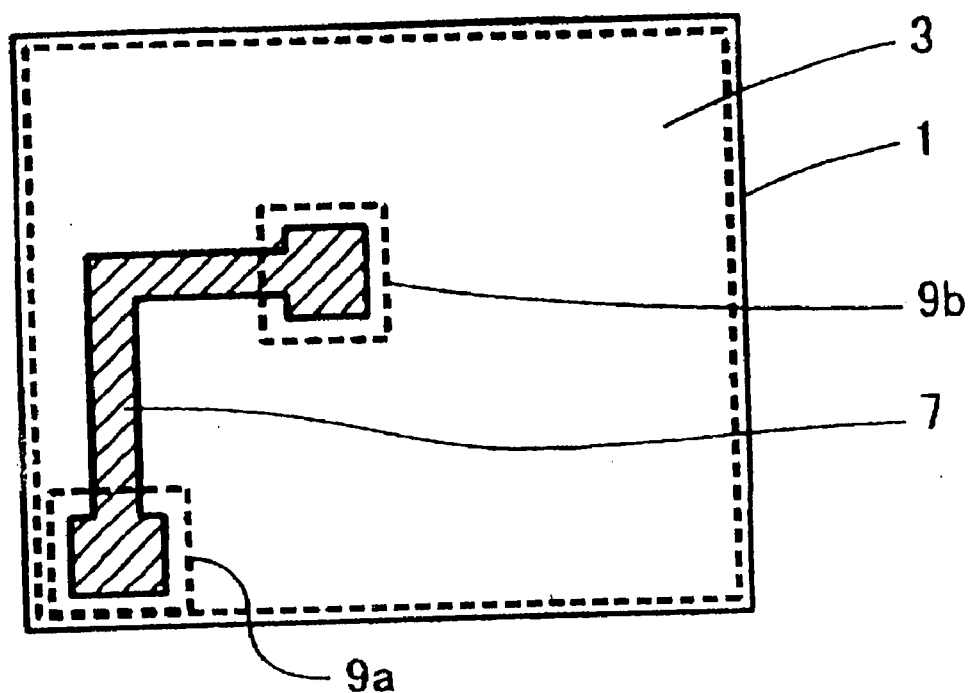
FIG. 5 is a plan view showing a three-dimensional MMIC according to a second embodiment of the present invention.
Figure 6:
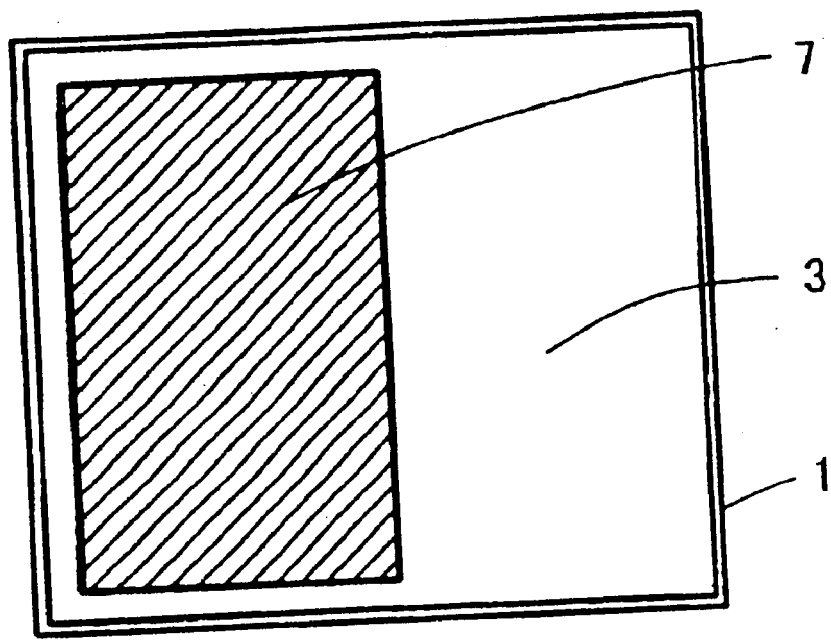
FIG. 6 is a plan view showing a three-dimensional MMIC according to a third embodiment of the present invention.
Figure 7:
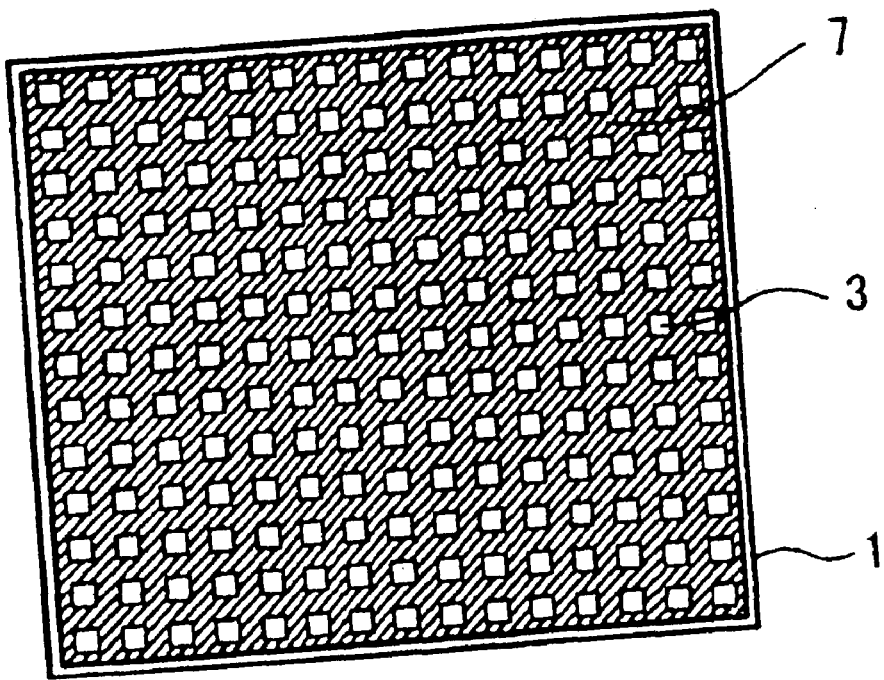
FIG. 7 is a plan view showing a three-dimensional MMIC according to a fourth embodiment of the present invention.

Other embodiments of the present invention are described below. FIG. 5 is a plan view of an MMIC according to a second embodiment of the present invention. FIG. 6 is a plan view of an MMIC according to a third embodiment of the present invention. FIG. 7 is a plan view of an MMIC according to a fourth embodiment of the present invention. FIGS. 5 to 7 show layouts for the power-supply conductor 7.

In the second embodiment shown in FIG. 5, the power-supply conductor 7 is provided in the form of a wiring line, and leads from a power-supply-pad position 9a to an active-region position 9b.

In the third embodiment shown in FIG. 6, the power-supply conductor 7 has a plane shape, and is selectively provided in part of the semiconductor substrate 1. The power-supply conductor 7 is disposed so as to cover an active region (not shown) which is supplied with power.

In the fourth embodiment shown in FIG. 7, the power-supply conductor 7 is provided in the form of a grid. Portions of the ground plate 3 are exposed all over the surface of substrate 1 from openings surrounded by the frames of the power-supply conductor 7. Accordingly, wherever the ground plate 3 is provided can be regarded as a surface having the ground potential. In addition, in a case in which each throughhole penetrating the ground plate 3 and the power-supply conductor 7 is used to form each wiring line for connecting to the active region on the semiconductor substrate 1, the openings can be automatically arranged as power-supply throughholes if each throughhole in the ground plate 3 and the active region on the semiconductor substrate 1 are set so as to align with each of the openings. Thus, it is not necessary to consider a layout for the throughholes in connection with the power-supply conductor 7.

In the case of having a plurality of the power-supply potentials required by the semiconductor device, a plurality of power-supply conductors can be provided in the present invention.

Figure 8:
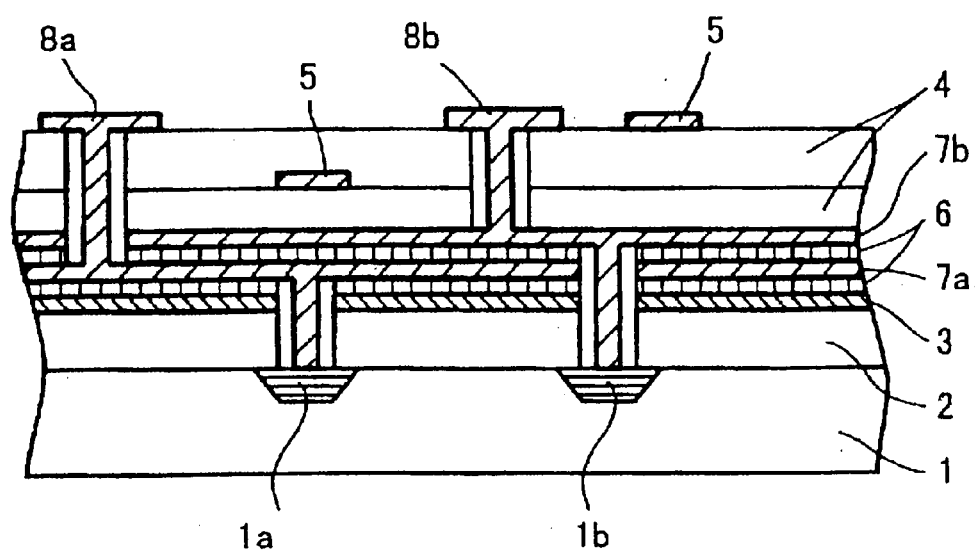
FIG. 8 is a cross-sectional view showing a three-dimensional MMIC according to a fifth embodiment of the present invention.

FIG. 8 shows a cross-section of an MMIC according to a fifth embodiment of the present invention, which is supplied with power-supply potentials. In the fifth embodiment, power-supply conductors 7a and 7b are connected respectively to power-supply pads 8a and 8b, and respectively connected to active regions 1a and 1b by throughholes. The power-supply conductors 7a and 7b are stacked, with insulating layers 6 provided therebetween. In this structure, the power-supply conductors 7a and 7b are capacitive-coupled with a ground plate 3, via the insulating layers 6 provided therebetween. Thus, the power-supply conductors 7a and 7b function as ground plates in a high frequency range.

Figure 9:
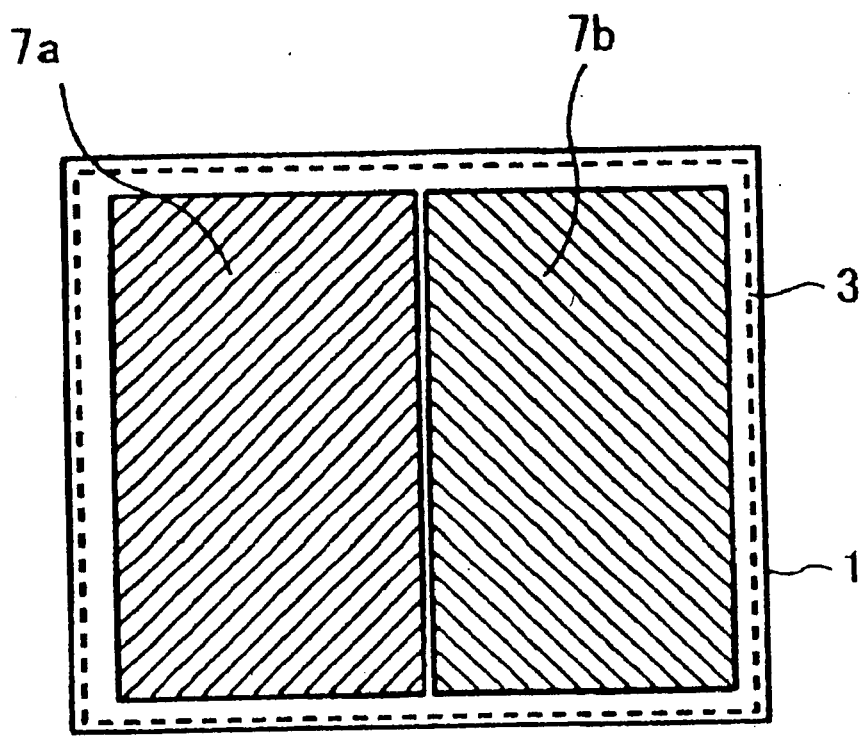
FIG. 9 is a plan view showing a three-dimensional MMIC according to a sixth embodiment of the present invention.

FIG. 9 shows a plan view of an MMIC according to a sixth embodiment of the present invention, which is supplied with power-supply potentials. The sixth embodiment differs from the fifth embodiment in FIG. 8 in that power-supply conductors 7a and 7b are two-dimensionally disposed.

In each of the foregoing embodiments, the one ground plate 3 is provided on the surface insulating layer 2. However, it is possible that a three-dimensional MMIC have a ground plate 3 for each insulating interlayer 4 on which each line conductor 5 is provided. In this case, the power-supply conductor 7 may be capacitive-coupled not with the lowest layer of ground plate 3 but with an upper layer of ground plate 3, via each insulating layer 6 provided therebetween.

Although the foregoing embodiments describe a type of three-dimensional MMIC having multilevel line-conductor layers, an advantage of the present invention in which a line conductor and a power-supply conductor can overlap with each other is definitely exhibited also by an MMIC which does not have multilevel line-conductor layers.

What is claimed is:
1. A high frequency semiconductor device comprising:
   a semiconductor substrate;
   a ground plate connected to the ground potential and provided substantially over all a surface of the semiconductor substrate;
   a power-supply conductor provided above said ground plate, with an insulating layer provided therebetween, said power-supply conductor being connected to a power-supply potential;
   a throughhole piercing through the ground plate for connecting the power-supply conductor to an active region formed in the semiconductor substrate through the throughhole; and
   a line conductor provided above said ground plate, with an insulating interlayer provided therebetween;
   wherein:
      said line conductor combines with said ground plate or said power-supply conductor to form a high frequency transmission line; and
      the capacitance between said line conductor and one of said ground plate and said power-supply conductor is smaller than the capacitance between said ground plate and said power-supply conductor.

2. A high frequency semiconductor device according to claim 1, wherein said insulating layer is made of a material having a dielectric constant higher than that of said insulating interlayer.

3. A high frequency semiconductor device according to claim 1, wherein said insulating layer is made of a material identical to that for said insulating interlayer, and has a thickness smaller than that of said insulating interlayer.

4. A high frequency semiconductor device according to claim 1, wherein a plurality of said line conductors are provided as a plurality of layers, with the insulating interlayers provided therebetween.

5. A high frequency semiconductor device according to claim 1, wherein said line conductor is provided as a single layer above said insulating interlayer.

6. A high frequency semiconductor device according to claim 1, wherein said power-supply conductor has a plane shape which is substantially identical to that of said ground plate.

7. A high frequency semiconductor device according to claim 1, wherein said power-supply conductor is provided in the form of a wiring line.

8. A high frequency semiconductor device according to claim 1, wherein said power-supply conductor is provided in the form of a plane on a selected area of the surface of said semiconductor substrate.

9. A high frequency semiconductor device according to claim 1, wherein said power-supply conductor is provided in the form of a grid.

10. A high frequency semiconductor device according to claim 1, wherein:
   a plurality of said power-supply conductors are provided as a plurality of layers each being electrically separated with the insulating layers provided therebetween; and
   one of the power-supply conductors is provided above said ground plate with one of the insulating layers provided therebetween.

11. A high frequency semiconductor device according to claim 1, wherein a plurality of the power-supply conductors are provided; and
   the power-supply conductors are electrically separated from each other and are two-dimensionally disposed on said semiconductor substrate.

12. A high frequency semiconductor device according to claim 1, wherein:
   a plurality of said ground plates are disposed along the thickness direction of the semiconductor substrate; and
   said power-supply conductor lies above at least one of the ground plates, with the insulating layer provided therebetween.

* * * * *